(12) United States Patent
Muraoka

(10) Patent No.: US 6,896,927 B2
(45) Date of Patent: May 24, 2005

(54) METHOD OF PREVENTING ORGANIC CONTAMINATION FROM THE ATMOSPHERE OF ELECTRONIC DEVICE SUBSTRATES AND ELECTRONIC DEVICE SUBSTRATES TREATED THEREWITH

(75) Inventor: Hisashi Muraoka, Yokohama (JP)

(73) Assignees: Nomura Micro Science Co., LTD, Atsugi (JP); Tama Chemicals Co., LTD, Kawasaki (JP)

( * ) Notice: Subject to any disclaimer, the term of this patent is extended or adjusted under 35 U.S.C. 154(b) by 0 days.

(21) Appl. No.: 10/318,003

(22) Filed: Dec. 13, 2002

(65) Prior Publication Data

US 2003/0138552 A1 Jul. 24, 2003

Related U.S. Application Data

(63) Continuation of application No. 09/633,851, filed on Aug. 7, 2000, now abandoned.

(30) Foreign Application Priority Data

Aug. 6, 1999 (JP) .......................................... 11-224314

(51) Int. Cl.$^7$ ................................................ B05D 5/00
(52) U.S. Cl. ......................... 427/58; 427/343; 427/344; 427/354; 427/384; 427/402
(58) Field of Search ........................... 427/419.2, 419.5, 427/419.7, 402, 343, 344, 354, 384, 58

(56) References Cited

U.S. PATENT DOCUMENTS

| | | | | |
|---|---|---|---|---|
| 5,129,955 A | * | 7/1992 | Tanaka | 134/2 |
| 5,350,489 A | | 9/1994 | Muraoka | 156/651 |
| 5,508,800 A | * | 4/1996 | Miyashita et al. | 356/30 |
| 5,705,089 A | * | 1/1998 | Sugihara et al. | 252/79.1 |
| 5,885,362 A | * | 3/1999 | Morinaga et al. | 134/2 |
| 5,989,353 A | * | 11/1999 | Skee et al. | 134/2 |
| 6,066,609 A | * | 5/2000 | Martin et al. | 510/175 |
| 6,068,788 A | * | 5/2000 | Kezuka et al. | 252/79.1 |
| 6,267,122 B1 | * | 7/2001 | Guldi et al. | 134/1.3 |

* cited by examiner

*Primary Examiner*—Kirsten Jolley
(74) *Attorney, Agent, or Firm*—Oblon, Spivak, McClelland, Maier & Neustadt, P.C.

(57) ABSTRACT

An electronic device substrate, such as a semiconductor silicon wafer or a liquid crystal glass substrate, with a surface which has just undergone cleaning treatment and which is covered with a clean oxide or nitride film which will readily adsorb organic contaminants is treated with an aqueous solution containing choline, or alternatively a similar substrate which has not been cleaned is treated with a treatment solution comprising a SC-1 solution to which choline has been added. Following drying, a surface concentration of choline of between $5\times10^{10}$ molecules~$7\times10^{12}$ molecules/cm$^2$ is adsorbed onto the substrate surface. This treatment suppresses organic contamination of the substrate from the atmosphere. As a result, the surface carbon concentration of an electronic device substrate can be suppressed to a value of no more than approximately $3\times10^{13}$ atoms/cm$^2$, even for manufacturing processes carried out in typical clean rooms with no chemical filters installed.

24 Claims, No Drawings

METHOD OF PREVENTING ORGANIC CONTAMINATION FROM THE ATMOSPHERE OF ELECTRONIC DEVICE SUBSTRATES AND ELECTRONIC DEVICE SUBSTRATES TREATED THEREWITH

This application is a continuation of application Ser. No. 09/633,851, filed Aug. 7, 2000, now abandoned.

BACKGROUND OF THE INVENTION

1. Field of the Invention

The present invention relates to an organic contamination prevention method for maintaining the cleanliness of an electronic device substrate such as a cleaned semiconductor silicon wafer or a liquid crystal glass substrate, and also relates to an electronic device substrate that has undergone organic contamination prevention treatment using the method.

2. Description of the Related Art

In semiconductor manufacturing processes, it was recognized early that organic contamination of the wafer surface was deleterious. The importance of reducing organic contamination to a minimum has become even more pronounced with the development of LSI ultra high integration, and the road map announced by the U.S. Semiconductor Industry Association incorporates an item regarding the amount of organic carbon. In 1997 the reported value was $1 \times 10^{14}$ carbon atoms/cm² for a DRAM 256 Mbit, but this figure reduces to $6 \times 10^{13}$ for a 1 Gbit in 2001, $3.5 \times 10^{13}$ for a 16 Gbit in 2005, and $1.8 \times 10^{13}$ for a 256 Gbit in 2009.

Large amounts of organic material exists in the atmosphere of semiconductor clean rooms, even in the case of ultra LSI, and the amount of this organic material exceeds 100 $\mu$g/m³ according to a variety of published reports. It is now known that when a silicon wafer is exposed to this type of atmosphere, organic material which is deleterious to the device manufacture is adsorbed onto the silicon surface, and analysis methods such as thermal desorption and gas chromatogram/mass spectrometry confirm this problem. Even in those cases where a substrate is stored inside a wafer case, outgas from the case material leads to the same type of organic contamination.

In order to remove organic contamination on a wafer surface, conventionally wet cleaning methods such as SC-1 treatment (composition of a standard cleaning solution is 1 part $NH_4OH$: 1 part $H_2O_2$ :5 parts $H_2O$ by volume, and typical conditions involve immersion for 10 minutes at 70° C.), or pirhana treatment (composition of a standard cleaning solution is 4 parts $H_2SO_4$: 1 part $H_2O_2$ by volume, and typical conditions involve immersion for 10 minutes at 130° C.) have been deemed the most effective. These types of treatment are generally conducted in a dust free environment, in a cleaning apparatus installed inside a so-called clean draft, but as described above such environments also incorporate organic material, and so organic contamination re-occurs following cleaning.

According to a number of academic reports, the majority of organic contamination which occurs when a wafer is exposed to the atmosphere inside a semiconductor clean room is due to dioctyl phthalate (DOP) or dibutyl phthalate (DBP). It has been reported that contamination of a wafer with DOP equivalent to $1 \times 10^{14}$ carbon atoms/cm² in the cleaning apparatus used for treatment prior to gate oxidation, results in a large reduction in the yield of high precision devices.

Recently, many academic publications have reported the removal of organic contamination by cleaning at room temperature with pure water incorporating several dozen ppm of ozone, and a reduction in the surface carbon atom concentration to a value in the order of $10^{12}$ atoms/cm² is reported as possible. However, the chemical oxide film generated by ozone displays quite strong chemical activity and the adsorption of organic matter thereto occurs extremely quickly, as disclosed, for example, in the 1996 spring proceedings of the Japan Society of Applied Physics, 27p-F-12. This phenomenon is explained on the basis of the strong polarity displayed by a hydrophilic silicon surface with a chemical oxide film, with organic material which incorporates polar groups, such as DOP, therefore adsorbing readily. Because similar chemical oxide films are also formed on the cleaned wafer surface in both SC-1 treatment and pirhana treatment, organic contamination from the atmosphere will also occur readily in these cases, via the same mechanism.

In those cases where a wafer is stored inside a wafer case, the only difference is that the organic materials which undergo adsorption are materials originating from additives in the case material such as butyl hydroxytoluene (BHT), which being a polar organic compound, will also adsorb readily onto the hydrophilic silicon surface.

Examples of cleaning methods in the academic literature which enable particularly large reductions in the organic carbon concentration on a wafer surface include dry treatments such as thermal oxidation, or treatment with ultraviolet radiation and ozone. However, even if the cleaning process is successful, in the same manner as a chemical oxidation film surface generated by the wet methods described above, the surface is still prone to organic contamination from the surrounding atmosphere. For example, according to the 1997 fall proceedings of the Japan Society of Applied Physics, 3p-R-2, adsorption of DOP from the atmosphere onto a thermal oxidation film surface exposed to the atmosphere of a clean room is several times the amount of contamination of an exposed bare silicon surface, while adsorption onto a surface treated with ultraviolet radiation and ozone is reported as being similarly high.

The installation of chemical filters, in which the main scavenger is activated carbon, in clean rooms, clean benches and clean drafts to enable the handling of wafers within a sufficiently clean environment is also being tested.

Electronic device substrates in a clean room manufacturing process are almost always stored inside a plastic case. After normal cleaning and immediately following rinsing and drying, when the surface activity is particularly high, the device is moved to the case. Conventionally these cases have been constructed of polypropylene for a number of reasons, including cost. As was described above, BHT is the major concern of the organic outgases produced from the polypropylene material. Consequently, a variety of improvements have been reported, and polypropylene cases with significantly reduced organic contamination are commercially available, although cases of polycarbonate, which is reported as a superior case material are not yet available.

As is evident from the road map mentioned above, organic carbon concentration on a wafer surface needs to be reduced to approximately $2 \times 10^{13}$ atoms/cm$^2$ by the year 2010. By using conventional mechanisms for removing deleterious organic impurities from the atmosphere and conducting the cleaning treatment in a dust free clean draft, and provided the clean room in which the wafer is exposed is of the same level of cleanliness, then it should be possible to reduce organic carbon on the wafer surface to the above level even with the aforementioned SC-1 or pirhana cleaning treatments. However, such a reduction would require installation of a plurality of chemical filters, such as activated carbon filters, for removing organic contamination, and moreover would require a thorough organic contamination removal system which was capable of supplying cleaned air at a sufficient flow rate.

However, the atmosphere in a semiconductor clean room incorporates many organic materials which will not adsorb to a wafer, but will be adsorbed onto activated carbon, and so the installed activated carbon chemical filters would deteriorate unexpectedly, and suffer from a short life span. Moreover, chemical filters are expensive, and so from an economic viewpoint, it would be desirable to develop a system which did not require the use of chemical filters.

SUMMARY OF THE INVENTION

An object of the present invention is to provide a method of preventing organic contamination which does not require the installation of chemical filters, and for which the surface carbon concentration on an electronic device substrate following cleaning is unlikely to increase beyond $3 \times 10^{13}$ atoms/cm$^2$ for a manufacturing process conducted within a typical clean room equipped with sufficient systems for countering dust.

In order to achieve the above object, firstly, the present invention provides a method of preventing organic contamination from the atmosphere of an electronic device substrate (hereafter referred to as the first contamination prevention method), wherein immediately following cleaning treatment, an electronic device substrate, the surface of which is covered with a clean oxide or nitride film which will readily adsorb organic contaminants, is treated with an aqueous solution containing choline, such that following drying, a surface concentration of choline of between $5 \times 10^{10}$ molecules~$7 \times 10^{12}$ molecules/cm$^2$ is adsorbed onto the substrate surface.

Secondly, the present invention also provides a method of preventing organic contamination from the atmosphere of an electronic device substrate (hereafter referred to as the second contamination prevention method), wherein an electronic device substrate is treated with an aqueous solution containing ammonia, hydrogen peroxide and no more than 2000 ppm of choline, and is subsequently rinsed in pure water, such that following drying a surface concentration of choline of between $5 \times 10^{10}$ molecules~$7 \times 10^{12}$ molecules/cm$^2$ is adsorbed onto the cleaned substrate surface.

In addition, the present invention also provides an electronic device substrate obtained from either one of the first and second organic contamination prevention methods, in which choline is adsorbed onto the substrate surface at a surface concentration of between $5 \times 10^{10}$ molecules~$7 \times 10^{12}$ molecules/cm$^2$.

Even in a typical clean room atmosphere, polar organic materials such as DOP will still adsorb onto wafer surfaces immediately following oxide film formation, or onto cleaned surfaces obtained by the cleaning of organic contamination using high strength cleaning methods such as ozone solution cleaning, pirhana cleaning or SC-1 cleaning, and after exposure of 15 hours, the surface carbon concentration will exceed $(5\sim10) \times 10^{13}$ atoms/cm$^2$. In contrast, a desirable silicon wafer surface carbon concentration during a device manufacturing process is currently no more than $3 \times 10^{13}$ atoms/cm$^2$, and if possible, values of no more than $2 \times 10^{13}$ atoms/cm$^2$ are preferred.

The methods of the present invention enable organic contamination to be suppressed to a value of no more than $3 \times 10^{13}$ atoms/cm$^2$ for an exposure of no more than 15 hours, even in a clean room environment in which no chemical filters are installed. In a typical electronic device manufacturing process, a substrate surface will not be exposed to a clean room environment for any longer than this 15 hour period, and so the present invention enables a practical prevention of organic contamination without the use of chemical filters. There are no particular restrictions on the state of the organic contamination materials which can be prevented, and possible states include gaseous, mist-like, colloidal, and fine particulate contamination. The contamination state may actually vary within the clean room environment, and there is no strict classification of the properties of the contamination.

By adding hydrogen peroxide or a surfactant which does not incorporate a metallic element to the treatment solution, the danger of micro-roughness developing can be avoided, and the capacity to remove fine particulate material can be improved.

Adding a phosphonic acid based chelating reagent to the treatment solution offers the advantage of preventing the problem peculiar to semiconductor alkali treatment reagents, wherein Fe from the treatment solution will readily contaminate a wafer. With a choline aqueous solution to which this type of organic material has been added, the combined effect of the choline means that very little organic contamination occurs on a treated wafer, which is a very desirable effect.

Furthermore, this type of treatment solution does not emit harmful gaseous impurities into the atmosphere, and so unlike conventional cleaning apparatus, exhaust devices are not necessarily required. This is a major advantage in terms of preventing atmospheric contamination. When combined with ozone solution cleaning, organic contamination resulting from the strong surface activity immediately following ozone solution treatment can be easily avoided by employing a continuous process. Only in this case is an exhaust treatment device necessary, although the ozone cleaning apparatus is of simple construction.

In a typical electronic device manufacturing process, the substrate is stored inside a plastic case for the majority of the time. Provided a substrate of the present invention is stored inside a case which has sufficient countermeasures in place for outgases, then the carbon concentration on the substrate surface can be maintained at a value of no more than $3\times10^{13}$ atoms/cm$^2$ for an extended time period, although the final value will depend on the amount of those outgases.

Hence the effect of the present invention is the ability to maintain the organic contamination on the surface of an electronic device substrate at a sufficiently low concentration level, even for high performance ultra LSI manufacture, under conditions of a typical class 10 clean environment, with no chemical filters, and with storage of the substrate inside a plastic case which has been improved to reduce outgases.

DETAILED DESCRIPTION OF THE PREFERRED EMBODIMENTS

Electronic device substrates which are the target of the present invention include, for example, bare silicon wafers, wafers comprising a film such as an oxide film, a nitride film or a polysilicon film, and glass substrates for use in liquid crystals.

The treatment target of the first contamination prevention method of the present invention is electronic device substrates with a clean oxide film or nitride film surface which is particularly susceptible to organic contamination immediately following cleaning treatment. Here, clean oxide film or nitride film surfaces which are particularly susceptible to organic contamination immediately following cleaning treatment include the following examples.

(1) The first example is hydrophilic surfaces generated on a substrate surface through chemical reaction, that is surfaces comprising a chemical oxide film. This type of silicon wafer surface terminates in OH groups, and water molecules will bond to the OH groups. Surfaces with Si—OH bonds or water molecules display strong polarity, and so are particularly susceptible to adsorption from the atmosphere of organic molecules with polar groups such as DOP and BHT. Cleaning reagents with strong organic contamination removal properties such as SC-1, pirhana, aqueous ozone solution, or ozone dissolved in acid display strong oxidizing properties, and so the substrate surface following cleaning will be coated in a chemical oxide film.

(2) Chemical oxide films generated by gaseous reaction are typified by ozone cleaning via ultraviolet light irradiation.

(3) Surfaces comprising oxide films or nitride films produced by heating or deposition, are surfaces for which the electronegativity of the O atoms or the N atoms is much greater than that of the Si atoms, and so the Si—O or Si—N bonds display strong polarity and are particularly susceptible to contamination from the atmosphere by polar organic molecules. Consequently, these types of surface are not hydrophilic, but may still be targeted by the present invention. Thermal oxidation of wafers is particularly effective in removing organic materials, but organic contamination of the wafer will begin as soon as the wafer is removed from the oxidation furnace.

(4) Treatment of a chemical oxide film with hydrofluoric acid makes the film hydrophobic, and because the wafer surface terminates in H atoms with an electronegativity similar to that of Si atoms, the polarity is weak. As a result, polar organic molecules are comparatively unlikely to adsorb to the surface. However, on exposure of this type of wafer to the air, over time the surface of terminal H atoms is converted to OH groups, so that a natural oxide film forms. Consequently, hydrophobic silicon surfaces which are left sitting in air, inside a wafer storage case, are prone to natural oxidation, and as described above, are then susceptible to contamination from the atmosphere by polar organic molecules. These types of surfaces are also targeted by the present invention.

The choline used in the present invention is an organic compound represented by the chemical formula shown below.

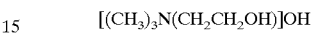

$[(CH_3)_3N(CH_2CH_2OH)]OH$

The molecule is a water soluble strong base, and a single molecule comprises five carbon atoms. As a complex of vitamin B, choline is an important physiological material, but it can also be chemically synthesized with ease, while in contrast, it is also easily broken down by biological treatment, and as such is an environmentally friendly treatment reagent.

An electronic device substrate treated by a method according to the present invention has a surface concentration of choline of between $5\times10^{10}$ molecules~$7\times10^{12}$ molecules/cm$^2$, and preferably between $1\times10^{11}$ molecules~$3\times10^{12}$ molecules/cm$^2$ adsorbed to the substrate surface. If the surface concentration is less than $5\times10^{10}$ molecules/cm$^2$ then the organic contamination prevention effect is insufficient, whereas at surface concentration values greater than $7\times10^2$ molecules/cm$^2$ the surface carbon concentration will exceed $3.5\times10^{13}$ atoms/cm$^2$ just on the basis of the adsorbed choline molecules.

As follows is a description of the features of each of the contamination prevention methods.

[First Contamination Prevention Method]

The methods of the present invention comprise adsorption of choline onto a substrate surface at a surface concentration of between $5\times10^{10}$ molecules~$7\times10^{12}$ molecules/cm$^2$, but this surface concentration depends on the choline concentration within the choline aqueous solution, and the length of time the substrate and the aqueous solution are in contact, and so cannot be categorized unconditionally. Typically, the choline aqueous solution used with the first method should have a choline concentration of between 1~2000 ppm, with values between 1~100 ppm preferable in practical embodiments, and values within a range between 10 and 100 ppm being even more desirable. If the choline concentration is high and the contact time is long, then in general the choline adsorption will increase and the uniformity of the choline adsorption onto the substrate surface will deteriorate, and so following treatment with the choline aqueous solution, it is preferable that the surface is rinsed in pure water.

As a specific embodiment of the invention, in those cases where the choline concentration in an aqueous solution is between 1~100 ppm, and preferably between 10~100 ppm, then the use of a flattening adjuvant is not particularly necessary. However, even within this concentration range, in order to maintain uniformity in the amount of choline adsorbed onto the substrate surface, it is still preferable that the surface is subsequently rinsed in pure water. Pure water rinses are particularly desirable in those cases where the choline concentration is towards the high end of the concentration range. For example, a pure water rinse of 10 minutes duration will reduce the amount of adsorbed choline to between $\frac{1}{3}$ and $\frac{1}{10}$. As a result, choline concentrations of between 10~100 ppm are preferable. If the choline concentration is too low, then a rinse treatment time of 10 minutes will result in insufficient choline being adsorbed, which is undesirable.

In another embodiment, a choline aqueous solution is used in which the choline concentration is between 1~2000 ppm, and preferably between 10~1000 ppm. In this embodiment, an adjuvant is jointly used for maintaining the flatness of the substrate surface. By use of the adjuvant the choline concentration is able to be increased within a range up to 2000 ppm. The higher the value of the choline concentration the greater the alkalinity, which offers the advantage of an increased ability to remove unwanted fine particles or organic materials left after the previous cleaning process. However, if the choline concentration is too high, then even with the use of the aforementioned flattening adjuvant, it becomes difficult to prevent the formation of haze on the substrate surface.

Examples of adjuvants which can be used to ensure the flatness of the substrate include hydrogen peroxide and surfactants. A hydrogen peroxide concentration of 5~0.3% by weight per 1000 ppm of choline is preferable, with values between 2~0.5% by weight being even more desirable. The concentration of hydrogen peroxide per 100 ppm of choline need only be approximately $\frac{1}{10}$ that of an aforementioned surfactant. The effect of the adjuvant is particularly marked in those cases where the aforementioned oxide film formed by chemical reaction is either a silicon chemical oxide film formed by treatment with a cleaning reagent comprising acid or ammonia and hydrogen peroxide, or alternatively a silicon chemical oxide film formed by treatment with a gas or a cleaning solution which incorporates ozone.

Surfactants which do not incorporate metal elements are preferred, and a suitable example is polyoxyethylene alkylphenol ether, which is a representative example of a non-ionic surfactant. The concentration of the surfactant should preferably be 0.005~0.02% by weight. If the concentration is too high then the surfactant becomes a major cause of surface organic contamination, whereas if the concentration is too low then the desired effect cannot be achieved.

In this embodiment, a rinse treatment in pure water is conducted following the treatment with the choline aqueous solution. If this rinse treatment is not carried out then the amount of choline adsorption will increase 3~10 fold, and there is a danger of regions of particularly strong adsorption developing.

[Second Contamination Prevention Method]

The treatment targets of the second organic contamination prevention method according to the present invention are electronic device substrates, and with this method, a substrate undergoes cleaning and contamination prevention treatment simultaneously.

In this second method, an aqueous solution comprising ammonia, hydrogen peroxide, and no more than 2000 ppm of choline is used as a treatment reagent. A cleaning reagent comprising ammonia, hydrogen peroxide and water (SC-1 solution) is already known, but the treatment reagent of this second method is obtained by adding choline to this SC-1 solution. By simple treatment with this treatment reagent followed by a normal pure water rinse, the surface carbon concentration can be greatly reduced. In such cases, the concentration of ammonia and choline needs to be thinned out appropriately.

With SC-1 treatment, adsorption of $NH_4$ groups to the wafer surface will occur, but the treatment solution used in this second method incorporates choline, which being strongly basic replaces this type of adsorption and therefore displays a contamination prevention action. This second contamination prevention method requires no alterations in cleaning apparatus and is consequently desirable in terms of cost and productivity.

The amount of ammonia used in this method should be between 3~0.2% by weight, and preferably between 2~0.5%, the amount of hydrogen peroxide used should be between 8~0.2% by weight, and preferably between 2~0.5%, and the choline concentration should be no more than 2000 ppm, and should preferably be between 500~1000 ppm. The higher the combined concentration of ammonia and choline, the higher the concentration of hydrogen peroxide needs to be in order to prevent haze generation on the treatment surface. If the choline concentration exceeds 2000 ppm then undesirable haze will form even if the hydrogen peroxide concentration is increased. If the choline concentration is too low then a sufficient organic contamination prevention effect cannot be achieved.

Following treatment with the aforementioned choline aqueous solution, a rinse treatment with pure water is conducted. This rinse treatment removes any abnormally adsorbed choline from the treatment surface.

With this method, a silicon chemical oxide film with all organic material removed is formed on the silicon surface, while because ammonia is a weak base and choline is a strong base, choline will be adsorbed to this film surface, and the resulting surface, following rinsing in pure water and subsequent drying, will prevent organic contamination from the atmosphere. This choline treatment also displays superior effects when used to treat newly formed oxide films or nitride films formed by chemical reaction either with a gas, or within a gaseous phase.

If required, small quantities of other additives may be added to the choline treatment reagent used in the present invention. For example, addition of a phosphonic acid based chelating reagent suppresses metallic contamination. In particular it suppresses the adhesion from an alkali treatment solution of Fe, which will readily contaminate a wafer. A preferred amount of additive is between 1 ppm~0.1 ppm. Examples of suitable phosphonic acid based chelates include nitrilotris(methylenephosphonic acid) tri choline salt, and ethylenediamine tetrakis (methylenephosphonic acid).

As was described above with regards conventional technology, the amount of organic contamination observed following consecutive powerful cleaning via SC-1 treatment and pirhana treatment, and subsequent exposure inside a clean room for 120 hours, has been reported as approximately 20 ng/cm$^2$. The majority of the contamination is DOP, and so a calculation on that basis produces an organic carbon concentration of approximately $8 \times 10^{14}$ atoms/cm$^2$. Most reports suggest that the amount of DOP contamination is proportional to the exposure time period, so a calculation for a 15 hour exposure time period produces a contamination of $1\times10^{14}$ atoms/cm$^2$. Furthermore, calculations for a 15 hour exposure time period based on previously reported examples detailing the exposure of oxide films and ozone treated surfaces to clean room conditions, produces a contamination value for only DOP of $5\times10^{13}$ atoms/cm$^2$.

During a device manufacturing process, the length of time for which a substrate surface is actually exposed directly to the clean room atmosphere is not a particularly long continuous period. Consequently, an organic carbon concentration on a wafer surface of no more than the target value of $3\times10^3$ atoms/cm$^2$ after an exposure of approximately 15 hours was deemed satisfactory. As described above, in a typical clean room, a clean silicon surface that has undergone powerful organic contamination removal treatment, or an oxide film surface, will take on contamination from the atmosphere equivalent to a carbon concentration of at least $(5\sim10)\times10^{13}$ atoms/cm$^2$ during a 15 hour exposure period.

In a manufacturing process, the length of time a substrate is exposed to the air inside a storage case is much longer than the time exposed directly to the clean room atmosphere. It is unlikely that during manufacture a substrate is stored continuously inside a case for a period of longer than one week, and so evaluations of atmospheric organic contamination during storage inside a case were conducted with a storage period of one week.

The degree of hydrophilicity of a wafer surface can be easily determined by a water drop contact angle. For example, a silicon surface immediately following cleaning with SC-1 displays a very strong hydrophilic property, and has a contact angle of 2~3. As the surface picks up organic contamination, the water drop contact angle increases. If a silicon wafer immediately following SC-1 cleaning is stored inside an aforementioned improved polypropylene wafer case for a period of one week, then the water drop contact angle increases significantly, whereas if during the rinse following SC-1 treatment, a rinse using a 10 ppm choline ultra pure aqueous solution of the present invention is inserted, then the same one week storage period results in an increase in the water drop contact angle of only ¼ the previously observed increase. Subsequent determination of the wafer surface carbon concentration by charged particle activation analysis revealed a result less than $3\times10^{13}$ atoms/cm$^2$.

When a room temperature rinse is conducted using a dilute choline solution of between 100 ppm and several ppm, and with a rinse period corresponding with the choline concentration, then the wafer surface carbon concentration is less than $3\times10^{13}$ atoms/cm$^2$, both immediately after drying, and also after exposure for approximately 15 hours within a clean bench atmosphere, which satisfies the object of the present invention. The choline treatment can be conducted via immersion methods or single wafer spin methods.

In tracer experiments using $^{11}$C radioactive labelled choline, then in the above case where a SC-1 cleaning treatment was followed by treatment with a 10 ppm dilute choline aqueous solution, the amount of $^{11}$C labelled choline adsorbed on the wafer surface was $(5\sim20)\times10^{11}$ molecules/cm$^2$. Rinsing the wafer for three minutes in pure water reduced this value to $2\times10^{11}$ molecules/cm$^2$. In contrast, in some cases where treatment was conducted with a 100 ppm choline aqueous solution and the subsequent rinse time period was shortened, the amount of $^{11}$C labelled adsorbed choline exceeded $7\times10^{12}$ molecules/cm$^2$.

From the above results, it is clear that the atmospheric organic contamination prevention effect observed when, following cleaning or oxidation, an electronic device substrate is treated with ultra pure water containing a small amount of choline, is due to choline adsorption onto the substrate surface. It is thought that the hydroxyethyl groups of the adsorbed choline molecules weaken the polarity of the chemical oxide film or the like, and obstruct the approach of organic materials with polar groups, as well as lowering the electric potential of the surface.

Heating a wafer on which $7\times10^{12}$ molecules/cm$^2$ of $^{11}$C labelled choline was adsorbed, for 5 minutes at 30° C. in an atmosphere of 98% nitrogen and 2% oxygen failed to produce any detectable choline. The $^{11}$C detection limit of the tracer method used was $1\times10^{10}$ molecules/cm$^2$. Consequently, in semiconductor device manufacturing processes which require heating, the choline adsorption of the present invention will cause no substantial problems.

Choline is a strong base, comparable to caustic soda, and room temperature treatment for 5~10 seconds with a 100 ppm dilute choline aqueous solution, or room temperature treatment for 2~3 minutes with a 10 ppm choline aqueous solution, generally does not result in the haze mode micro-roughness observed on heated cleaning treatment with a SC-1 solution of composition 1:1:5. However depending on the wafer, and particularly on the history of the wafer, this type of flatness related problem may occur. In such cases, addition of an oxidizing agent or a surfactant such as hydrogen peroxide (of course the composition must not include any metallic constituents) will resolve any problems of micro-roughness resulting from the treatment reagent.

With issues relating to surface flatness such as micro-roughness, it is safer to ensure sufficient leeway during actual manufacturing processes. If an amount of hydrogen peroxide which corresponds with the choline concentration is added to a choline aqueous solution of a concentration of no more than 2000 ppm, then a haze mode can be successfully avoided, but if the choline concentration exceeds 2000 ppm then the haze cannot be suppressed with hydrogen peroxide. At a choline concentration of 1000 ppm, if the hydrogen peroxide concentration is suitable, then the treatment amounts to alkali-hydrogen peroxide cleaning, and so produces the same fine particle removal effect as SC-1. If the above cleaning treatments which generate surfaces susceptible to organic contamination are followed by treatment with a choline/$H_2O_2$ solution, then choline will adsorb onto the silicon surface, and the surface carbon concentration can be maintained at a level of no more than $3\times10^{13}$ atoms/cm$^2$ even after drying, or after exposure for 15 hours to a class 10 clean bench atmosphere, thereby satisfying the object of the present invention. In tracer experiments using $^{11}$C labelled choline, the amount of choline adsorption in the above case was no more than $5\times10^{12}$ atoms/cm$^2$. Moreover, the choline/$H_2O_2$ treatment also adds a strong fine particle removal effect to the effects of the previous cleaning treatment.

Addition of a small amount of choline to a 20~30 ppm ozone aqueous solution, and conducting single wafer spin cleaning produces a strong fine particle removal effect, and organic contamination can also be removed. Following completion of this type of cleaning, by halting the ozone supply, the atmospheric organic contamination prevention effect of the choline of the present invention can immediately take effect, thereby resolving the problem of abnormal organic contamination resulting from the strong activity of ozone treated surfaces.

As follows is a description of the present invention with reference to examples, although the present invention is in no way limited to the examples presented below.

EXAMPLES

The samples used in the experiments were 6 inch P-type (100) silicon wafers with a carbon concentration of $8 \times 10^{14}$ atoms/cm$^3$, and with the exception of example 5, were used exactly as supplied by the manufacturer. Measurements of the surface carbon concentration following cleaning or following exposure to certain atmospheres were conducted in an air circulation type evaluation clean room equipped with activated carbon filters 1076 from ESI Corporation, using specially designed instruments to prevent organic contamination, by cutting the silicon wafer into 2 cm×2 cm chips and submitting the chips to charged particle activation analysis using a method disclosed in Japanese Unexamined Patent Application No. 10-253346 detailing sample cases for analysis.

In the majority of the cleaning treatments described in the following examples no chemical filters were installed, although the treatments were carried out with equipment provided inside a class 10 clean draft to ensure a dust free environment. Immersion cleaning was conducted by immersion of a hand operated quartz carrier on which was set three 6 inch wafers, into a rectangular quartz chemical treatment tank containing an inserted quartz heater. Example 5 used two of these installations whereas the remaining immersion treatment examples used only one. Furthermore, a rinsing quartz tank in which a quick dump rinse could be conducted with a two or three minute cycle time was provided alongside. Drying of the wafers was carried out on a nearby 4000 rpm single wafer spin dryer, which was designed in-house for 6 inch wafers. In order to also enable cleaning to be conducted at 1500 rpm, the spin drying device was also provided with supply mechanisms for a cleaning liquid and a rinse liquid. All single wafer cleaning in the examples was carried out using this simple spin device.

Furthermore, the environment in which the treated samples were left to stand for extended periods, that is the location in which the wafer surfaces were exposed, was a class 10 clean bench with the same level of cleanliness as the cleaning draft. Moreover, example 4, example 6, and example 7 were operated inside a class 10 clean draft in a clean room inside a radiation controlled area, and exposure of the sample following treatment was also conducted in the same environment. The TOC of the ultra pure water used in each of the examples was 30 ppb in a radiation controlled area, and was no more than 1 ppb in all cases.

Comparative Example 1

A SC-1 cleaning solution (1 part NH$_4$OH:1 part H$_2$O$_2$: 12 parts H$_2$O) was prepared in a chemical tank, and following immersion cleaning of a wafer for 10 minutes at 70° C., the wafer was subjected to a 15 minute quick dump rinse, and then dried. Measurement of the water drop contact angle immediately following drying produced a result of 3° C. A further measurement of the water drop contact angle following sealed storage of the wafer for 7 days inside an aforementioned improved polypropylene wafer case, produced a result of 15° C.

Example 1

Two wafers were set on a carrier, and following cleaning with the same SC-1 solution as was used for the comparative example 1, the wafers were subjected to a quick dump rinse, with a three minute rinse with ultra pure water containing 10 ppm of choline inserted in the middle of this quick dump rinse process. The wafers were then rinsed with ultra pure water and spin dried before being stored with the above wafer from the comparative example 1. After storage for 7 days, a measurement of the water drop contact angle was carried out for one of the wafers, at the same time as the above comparative example measurement, and produced a result of approximately 6° C. A measurement of the surface carbon concentration for the remaining stored wafer using charged particle activation analysis yielded a result of $2.1 \times 10^{13}$ atoms/cm$^2$.

Ten wafers were prepared by treatment with a dilute choline solution, in the same manner as the example 1, and following storage for a period of 30 days in a sealed wafer case of polycarbonate designed to counteract outgases, the surface carbon concentrations thereof were measured, and yielded values of between $(1.9 \sim 2.4) \times 10^{13}$ atoms/cm$^2$.

Example 2

Following treatment of two wafers in the same manner as that described above for the example 1, one of the wafers was subjected to charged particle activation analysis immediately following drying. The surface carbon concentration was $1.9 \times 10^{13}$ atoms/cm$^2$. The remaining wafer was exposed for 15 hours to a clean bench atmosphere. Subsequent charged particle activation analysis revealed a surface carbon concentration of $1.7 \times 10^{13}$ atoms/cm$^2$.

A wafer was prepared by treatment with the same dilute choline solution used in the example 2, and a comparison of haze mode micro-roughness was made with the wafer from the comparative example which had undergone only SC-1 treatment, but no significant difference was observed. If the choline concentration is sufficiently dilute, and moreover the immersion occurs for a short time period at room temperature, then for a typical silicon wafer, generation of micro-roughness from this type of treatment can be substantially prevented.

Example 3

Single wafer spin cleaning utilizing the strong organic contamination prevention effects of an ozone aqueous solution is increasingly being implemented as a new method for dealing with increasing wafer diameters. In this example, to a basic sequence comprising a 15 second treatment with a 20 ppm ozone aqueous solution, a 15 second treatment with dilute hydrofluoric acid, a 30 second treatment with a 20 ppm ozone aqueous solution, a rinse with ultra pure water, and subsequent spin drying, was added a step in which ultra pure water containing 100 ppm choline was supplied for a period of 10 seconds during the ultra pure water rinse, in order to investigate the effects of choline. Measurement of the surface carbon concentration using charged particle activation analysis immediately following drying produced a result of $3.2 \times 10^{13}$ atoms/cm$^2$, whereas after 15 hours the figure had reduced to $2.5 \times 10^{13}$ atoms/cm$^2$.

The ultra pure water used for the rinse treatment had a TOC (total organic carbon) value of no more than 1 ppb, and as it was evident from the previous examples that organic contamination from the atmosphere of choline treated surfaces of the present invention occurred very slowly, it is thought that almost all of the surface carbon observed immediately following treatment is due to choline adsorption. The amount of that choline adsorption is calculated to be approximately $7 \times 10^{12}$ molecules/cm$^2$.

Example 4

It is known that if an ozone aqueous solution is made alkaline, then the ozone will break up more readily and disappear in a shorter time. However, if a single wafer spin cleaning device is used, and a dilute choline aqueous solution and an ozone aqueous solution are supplied simultaneously onto the wafer from separate nozzles, then the ozone will act on the wafer with a relatively strong concentration. Many of the ultra fine particles on the wafer surface are attached via liquid bridging mechanisms to a spotted contamination film of oil based organic materials such as DOP, and because the oxidizing power of the ozone breaks down liquid bridging and the choline controls the zeta potential, spin cleaning with a solution containing ozone and choline has the combined effect of removing both organic material and fine particles. As follows is an example of the present invention which utilizes this type of cleaning.

A six inch hydrophilic silicon wafer was treated with dilute hydrofluoric acid to remove the natural oxide film, and was then immersed in a substantially neutral solution containing a dispersion of a radioactive $^{198}$Au colloid with a particle diameter of no more than 0.1 μm, to form a sample wafer with the colloid adsorbed thereon. Radiation from the wafer was measured using a wafer NaI scintillator, in order to determine the weight of adsorbed colloid. The single wafer spin cleaning device from example 3 was moved into a draft inside a radiation controlled area and a 10 ppm choline aqueous solution nozzle added, and the choline aqueous solution treatment step was then added to the sequence of the example 3. That is, during the 30 second treatment with a 20 ppm ozone aqueous solution, following the 15 second treatment with a 20 ppm ozone aqueous solution and the 15 second treatment with dilute hydrofluoric acid, a 10 ppm choline aqueous solution was also supplied onto to the wafer. After 30 seconds, the supply of the ozone aqueous solution was halted, and following a further 20 second treatment with just the 10 ppm choline aqueous solution, the treatment was completed with a 20 second rinse with ultra pure water and subsequent spin drying.

The dried wafer was immediately cut into 2 cm×2 cm chips, and five of the chips subjected to radiation measurement using a well type NaI scintillator, to determine the amount of residual colloid on the wafer. The results showed that 93% of the colloid particles had been removed. A charged particle activation analysis of another chip immediately following cutting revealed a surface carbon concentration immediately following cleaning of $2.1 \times 10^{13}$ atoms/cm$^2$. At the time of cutting, some chips were also left to stand for 15 hours in the aforementioned clean bench before analysis, and the average surface carbon concentration of these chips was $2.3 \times 10^{13}$ atoms/cm$^2$.

Example 5

Used silicon wafers are sometimes repolished and used as monitor silicon wafers for managing semiconductor manufacturing processes, but this repolishing sometimes produces problems of micro-roughness. Furthermore, large amounts of organic contamination may remain, particularly on the underside of the wafer. To replicate such cases, two samples were prepared by taking wafers from the example 1 which were not used in the measurements following the case storage period, having these wafers repolished by a wafer regeneration maker, and then spin coating HMDS onto the underside of the wafers. The wafers then underwent pirhana cleaning which displays a strong organic contamination removal effect, and were then subjected to immersion treatment in an aqueous solution containing 0.1% by weight of choline and 1% by weight of hydrogen peroxide, at which point one wafer was rinsed, dried and measured for surface carbon concentration, while the other wafer was exposed for 15 hours in an aforementioned clean bench with the wafer surface in a vertical position, before the surface carbon concentration was determined.

A 4 parts $H_2SO_4$: 1 part $H_2O_2$ solution was used to fill one of the quartz tanks inside the aforementioned draft, while the other quartz tank was filled with a choline/$H_2O_2$ treatment solution, so that a 10 minute immersion at 130° C. could be conducted in the former tank, and a 10 minute immersion at 70° C. conducted in the latter tank. Rinsing was carried out using a common rinse device, with 2 minute rinses being repeated 5 times. The surface carbon concentration values were $2.3 \times 10^{13}$ atoms/cm$^2$ for the mirror surface and $2.6 \times 10^{13}$ atoms/cm$^2$ for the underside when measured immediately after rinsing and drying, and were $2.5 \times 10^{13}$ atoms/cm$^2$ for the mirror surface and $2.4 \times 10^{13}$ atoms/cm$^2$ for the underside when measured after 15 hours standing, that is, essentially equal within the margin of error.

Example 6

$^{11}$C labeled $CH_3I$, which will display a positron emission type (β+) decay, was prepared in an automatic synthesis apparatus, and then reacted with dimethyl ethanol amine to produce choline iodide. From this radioactive choline iodide, an ion exchange membrane was then used to produce radioactive choline with an extremely large specific radioactivity in which one carbon of a methyl group was converted to a $^{11}$C atom. By addition of a minute quantity of this radioactive choline to a choline containing solution of the present invention, the β decay of $^{11}$C means that coincidence methods can be used as a measurement of radioactivity, and so choline determinations can be conducted with extremely high levels of detectability. Determinations of adsorbed choline on a wafer surface following treatment can be conducted in the same manner by cutting the wafer into 2 cm×2 cm chips. However as the half life of $^{11}C$ is only 20 minutes, if a $^{11}C$ adsorbed wafer is left standing for several hours, then choline determination becomes impossible.

The above addition was made to a 10 ppm dilute choline aqueous solution, and a wafer which had just been cleaned with a standard SC-1 solution was immersed in the solution for 3 minutes at room temperature, subsequently rinsed for 3 minutes in pure water, and then dried, before being subjected to a measurement of the amount of choline adsorbed onto the wafer surface based on the value of radioactivity. The result, at $2\times10^{11}$ molecules/cm$^2$, shows the effectiveness even at very small levels of adsorption. Moreover, when spin drying was conducted without the pure water rinse step, the amount of choline adsorbed on the wafer surface was 3~10 fold greater, and locations in which the adsorption was several hundred times the above value were also observed. Consequently, normally it is preferable that a pure water rinse is carried out following the choline treatment. When a SC-1 cleaned wafer was rinsed for 10 minutes in a 1 ppm dilute choline aqueous solution, then without a subsequent pure water rinse the choline adsorption on the wafer surface was approximately $(5~10)\times10^{10}$ molecules/cm$^2$. When this type of addition was made to a 100 ppm choline aqueous solution from the treatment described in example 3, and the rinse treatment was conducted as described in the example 3, the amount of choline adsorbed on the wafer surface was $7\times10^{12}$ molecules/cm$^2$.

Furthermore, a treatment solution containing 0.5% by weight of choline and 5% by weight of $H_2O_2$ was prepared and the aforementioned radioactive choline added, and a wafer which had just been cleaned with a standard SC-1 solution was treated by immersion in the solution for 3 minutes at approximately 70° C., was subsequently rinsed for 10 minutes in ultra pure water, and was then dried before a measurement of the amount of choline adsorbed onto the wafer surface was carried out, which revealed a rather high value of $1.5\times10^{13}$ molecules/cm$^2$. However, when the addition was made to a treatment solution containing 0.2% by weight of choline and 5% by weight of $H_2O_2$, and a wafer which had just been cleaned with the same standard SC-1 solution was treated by immersion in the solution for 10 minutes at approximately 70° C., was subsequently rinsed for 10 minutes in ultra pure water, and was then dried before a measurement was carried out, the observed adsorption value was $5\times10^{12}$ molecules/cm$^2$.

Heating a wafer with a surface choline adsorption of $7\times10^{12}$ molecules/cm$^2$ for 5 minutes at 300° C. in an atmosphere of 98% nitrogen and 2% oxygen failed to produce any detectable choline. The detection limit of the $^{11}C$ tracer method used was $1\times10^{10}$ molecules/cm$^2$. Consequently, in semiconductor device manufacturing processes which require heating, no substantial problems will occur.

Example 7

The addition of surfactants can also be effective in improving the fine particle removal effect of SC-1 treatment as well as improving micro-roughness. Consequently, tests were conducted on the addition of surfactants to choline aqueous solutions. In this example, a sample was prepared by taking an oxidized wafer in which any organic material had been removed by treatment in an oxidizing atmosphere at 900° C. for 30 minutes, adsorbing a radioactive $^{198}Au$ colloid with a particle diameter of no more than 0.1 μm onto the wafer surface as described in the example 4, and then calculating the amount of adsorbed colloid based on the value of the measured radioactivity. This sample was then subjected to single wafer spin treatment with an aqueous solution containing 0.1% by weight of choline, 0.01% by weight of polyoxyethylene nonylphenol ether, and 1 ppm of a phosphonic acid based chelating reagent. The single wafer spin cleaning device described above was used, with the treatment solution supplied for one minute, a spin rinse subsequently conducted for one minute with ultra pure water, and the wafer then spin dried. The wafer was then cut into 2 cm×2 cm chips, and five of the chips subjected to radioactivity measurements to determine the amount of residual colloid. The results showed that 90% of the colloid particles had been removed. Determination of the surface carbon concentration of another chip by charged particle activation analysis produced a result of $2.7\times10^{13}$ atoms/cm$^2$.

In this choline treatment, the choline prevents the adsorption of the organic surfactant and the organic chelating reagent onto the wafer surface. When a conventional cleaning reagent which incorporates organic material such as a SC-1/surfactant treatment solution was used, the surfactant would adsorb onto the silicon surface, and subsequent treatment to remove the surfactant (such as ozone treatment) was necessary. However, this choline treatment requires no such subsequent treatment, and a simple subsequent rinse with pure water will achieve a low surface carbon concentration.

When 1 ppb of radioactive $^{59}Fe$ was added to the above treatment solution and the same spin treatment carried out, then a measurement of the amount of $^{59}Fe$ adsorbed onto the wafer surface using radioactivity revealed a value of less than $10^9$ atoms/cm$^2$.

Furthermore, one of the chips was then exposed in a clean draft for 15 hours, but the surface carbon concentration observed was $2.4\times10^{13}$ atoms/cm$^2$, showing that organic contamination from the atmosphere is being effectively prevented.

Example 8

Two hydrophilic silicon wafers were treated with dilute hydrofluoric acid to remove the natural oxide film and produce a hydrophobic surface, and were then retained inside a sealed vessel incorporating $^{14}C$ labeled DOP in the base thereof, and heated for four hours. Following cooling, the wafers were removed and one of the wafers was measured for radioactivity using an imaging plate. In the measurement, a $^{14}C$ concentration distribution was also obtained, and showed that the concentration of DOP surface contamination from this treatment was substantially uniform, and was $1.2\times10^{14}$ molecules/cm$^2$. The remaining wafer was subjected to immersion cleaning for 10 minutes at 70° C. in an aqueous treatment solution comprising a SC-1 solution of 0.5 parts $NH_4OH$: 1 part $H_2O_2$: 12 parts $H_2O$ to which had been added 500 ppm of choline.

Following a pure water rinse, the surface was an extremely hydrophilic surface comprising a chemical oxide film, which was then dried and subsequently cut into 2 cm×2 cm chips. For three of the chips, the amount of residual $^{14}$C labeled DOP on the surface was measured by radioactivity using an imaging plate, and the residual ratio of DOP after washing was used to compare the effectiveness of the cleaning reagent against DOP. The results revealed an average amount of residual DOP of $1.8\times10^{11}$ molecules/cm$^2$ (a carbon concentration of $4\times10^{12}$ atoms/cm$^2$) and a residual ratio of 0.15%, which indicates that SC-1 with choline added offers the same organic contamination removal performance as an SC-1 solution of a standard composition. Another three chips were analyzed for carbon concentration by charged particle activation analysis, and yielded an average value of $9\times10^{12}$ atoms/cm$^2$. This concentration level is slightly better than the other examples. It is thought that a large proportion of the difference between the carbon concentration and the amount of residual DOP observed is due to the adsorbed choline, and to organic contamination from the atmosphere which the choline has been unable to prevent entirely, either during drying or during transfer of the samples to a case for analysis.

Another three chips were exposed in the clean draft of the previous examples for 15 hours, and the surface carbon concentration then determined by charged particle activation analysis. The average result was $1.1\times10^{13}$ atoms/cm$^2$, indicating that organic contamination from the atmosphere is being effectively prevented.

What is claimed is:

1. A method of preventing organic contamination of an electronic device substrate comprising a surface covered with either one of a clean oxide film or a clean nitride film, said method comprising:
   (i) treating the electronic device substrate with an aqueous solution comprising choline; and
   (ii) drying the treated electronic device substrate, wherein the adsorbed concentration of choline on the surface of the electronic device substrate is from $5\times10^{10}$ to $7\times10^{12}$ molecules/cm$^2$.

2. The method according to claim 1, wherein the choline concentration of the aqueous solution is from 1 to 100 ppm.

3. The method according to claim 1, wherein the aqueous solution comprises an adjuvant and has a choline concentration of from 1 to 2000 ppm.

4. The method according to claim 3, wherein the adjuvant comprises hydrogen peroxide or a surfactant.

5. The method according to claim 1, wherein the surface is covered with said clean oxide film, and wherein the clean oxide film has been formed by treatment with a chemical reagent comprising either an acid or ammonia, and hydrogen peroxide.

6. The method according to claim 1, wherein the clean oxide film comprises a silicon chemical oxide film fanned by treatment of the electronic device substrate with either a gas or a cleaning reagent comprising ozone.

7. The method according to claim 1, wherein the aqueous solution comprising choline further comprises no more than 1 ppm of a phosphonic acid chelating reagent.

8. The method according to claim 1, wherein the adsorbed concentration of choline on the surface of the electronic device substrate is from $1\times10^{11}$ to $7\times10^{12}$ molecules/cm$^2$.

9. The method according to claim 1, wherein the adsorbed concentration of choline on the surface of the electronic device substrate is from $1\times10^{11}$ to $3\times10^{12}$ molecules/cm$^2$.

10. The method according to claim 4, wherein the adjuvant comprises a surfactant, which surfactant comprises a non-ionic surfactant which does not contain a metal.

11. The method according to claim 10, wherein the non-ionic surfactant comprises polyoxyethylene alkylphenol ether.

12. The method according to claim 10, wherein the concentration of the surfactant is from 0.005 to 0.02% by weight.

13. The method according to claim 1, further comprising cleaning the electronic device substrate before step (i).

14. The method according to claim 13, wherein the surface of the electronic device substrate comprises absorbed organic contaminants.

15. The method according to claim 1, further comprising rinsing the electronic device substrate with water.

16. The method according to claim 3, further comprising rinsing the electronic device substrate with water.

17. The method according to claim 1, wherein the electronic device substrate comprises at least one of bare silicon wafers; wafers comprising an oxide film, nitride film or polysilicon film; and glass substrates.

18. A method of preventing organic contamination of an electronic device substrate having a surface covered with either one of a clean oxide film or a clean nitride film, said method comprising:
   (i) treating the electronic device substrate with an aqueous solution comprising ammonia, hydrogen peroxide and no more than 2000 ppm of choline;
   (ii) rinsing the electronic device substrate with water; and
   (iii) drying the treated electronic device substrate, wherein the adsorbed concentration of choline on the surface of the electronic device substrate is from $5\times10^{10}$ to $7\times10^{12}$ molecules/cm$^2$.

19. The method according to claim 18, wherein the aqueous solution comprises 0.2 to 3% by weight of ammonia and 0.2 to 8% by weight of hydrogen peroxide.

20. The method according to claim 18, wherein the aqueous solution comprises 100 to 500 ppm of choline.

21. The method according to claim 18, wherein the aqueous solution further contains a phosphonic acid based chelating reagent.

22. The method according to claim 18, wherein the surface concentration of choline is from $1\times10^{11}$ to $7\times10^{12}$ molecules/cm$^2$.

23. The method according to claim 18, wherein the surface concentration of choline is from $1\times10^{11}$ to $3\times10^{12}$ molecules/cm$^2$.

24. The method according to claim 18, wherein the electronic device substrate comprises at least one of bare silicon wafers; wafers comprising an oxide film, nitride film or polysilicon film; and glass substrates.

* * * * *